(12) United States Patent
Parish, IV et al.

(10) Patent No.: US 7,322,400 B2
(45) Date of Patent: Jan. 29, 2008

(54) COOLING APPARATUS HAVING LOW PROFILE EXTRUSION

(75) Inventors: Overton L. Parish, IV, Lubbock, TX (US); Roger S. DeVilbiss, Dallas, TX (US)

(73) Assignee: ThermoTek, Inc., Carrollton, TX (US)

( * ) Notice: Subject to any disclaimer, the term of this patent is extended or adjusted under 35 U.S.C. 154(b) by 0 days.

(21) Appl. No.: 10/328,438

(22) Filed: Dec. 23, 2002

(65) Prior Publication Data

US 2003/0089486 A1    May 15, 2003

Related U.S. Application Data

(62) Division of application No. 09/328,183, filed on Jun. 8, 1999.

(60) Provisional application No. 60/088,428, filed on Jun. 8, 1998.

(51) Int. Cl.
     *F28F 7/02* (2006.01)
(52) U.S. Cl. ............... 165/104.21; 165/104.26
(58) Field of Classification Search ........... 165/104.14, 165/104.21, 104.33, 104.26, 104.19, 80.4; 361/700, 697, 699, 704; 257/714–716; 174/15.1
See application file for complete search history.

(56) References Cited

U.S. PATENT DOCUMENTS

| | | | |
|---|---|---|---|
| 3,528,494 A * | 9/1970 | Levedahl ............... | 165/104.26 |
| 4,072,188 A | 2/1978 | Wilson et al. ............. | 165/80 |
| 4,196,504 A | 4/1980 | Eastman | |
| 4,279,294 A | 7/1981 | Fitzpatrick et al. | |
| 4,280,519 A | 7/1981 | Chapman | |
| 4,381,032 A | 4/1983 | Cutchaw ..................... | 165/46 |
| 4,470,450 A * | 9/1984 | Bizzell et al. ......... | 165/104.26 |
| 4,503,906 A | 3/1985 | Andres et al. | |
| 4,550,774 A | 11/1985 | Andres et al. | |
| 4,558,395 A | 12/1985 | Yamada et al. ............. | 361/385 |
| 4,640,347 A | 2/1987 | Grover et al. | |
| 4,675,783 A | 6/1987 | Murase et al. | |
| 4,729,060 A | 3/1988 | Yamamoto et al. ......... | 361/385 |
| 4,830,100 A | 5/1989 | Kato et al. ............. | 165/104.14 |
| 4,854,377 A | 8/1989 | Komoto et al. ............ | 165/80.4 |
| 4,880,052 A * | 11/1989 | Meyer, IV et al. ..... | 165/104.26 |
| 4,880,053 A | 11/1989 | Sheyman | |
| 4,884,630 A | 12/1989 | Nelson et al. | |
| 4,896,716 A | 1/1990 | Sotani et al. .................. | 165/54 |

(Continued)

FOREIGN PATENT DOCUMENTS

DE          1284506          12/1968

(Continued)

OTHER PUBLICATIONS

Thermalex, Inc. Brochure, 2758 Gunter Park Drive West, Montgomery, AL, no date.

(Continued)

*Primary Examiner*—Teresa J. Walberg
(74) *Attorney, Agent, or Firm*—Winstead PC (57) ABSTRACT

A cooling apparatus has a low profile extrusion with a plurality of micro tubes extended there through. The low profile extrusion is placed into thermal connection with heat producing components. A heat transfer fluid removes heat via an adiabatic process.

27 Claims, 7 Drawing Sheets

U.S. PATENT DOCUMENTS

| | | | |
|---|---|---|---|
| 4,909,315 A | 3/1990 | Nelson et al. ............. 165/80.3 |
| 4,921,041 A | 5/1990 | Akachi |
| 4,982,274 A | 1/1991 | Murase et al. ................ 357/82 |
| 5,002,122 A | 3/1991 | Sarraf et al. |
| 5,005,640 A | 4/1991 | Lapinski et al. |
| 5,036,384 A | 7/1991 | Umezawa .................... 357/82 |
| 5,044,429 A | 9/1991 | Sakaya et al. |
| 5,054,296 A | 10/1991 | Sotani et al. .............. 62/259.1 |
| 5,069,274 A * | 12/1991 | Haslett et al. ......... 165/104.26 |
| 5,076,351 A | 12/1991 | Munekawa et al. |
| 5,084,966 A | 2/1992 | Murase .................. 29/890.043 |
| 5,099,311 A | 3/1992 | Bonde et al. |
| 5,133,492 A * | 7/1992 | Wohrstein et al. ............. 225/2 |
| 5,139,546 A | 8/1992 | Novobilski |
| 5,159,529 A | 10/1992 | Lovgren et al. ............ 361/385 |
| 5,168,921 A | 12/1992 | Meyer, IV |
| 5,186,252 A | 2/1993 | Nishizawa et al. ......... 165/181 |
| 5,199,487 A | 4/1993 | DiFrancesco et al. |
| 5,203,399 A * | 4/1993 | Koizumi ................ 765/104.33 |
| 5,283,464 A | 2/1994 | Murase ...................... 257/714 |
| 5,283,715 A * | 2/1994 | Carlsten et al. ............. 361/702 |
| 5,285,347 A * | 2/1994 | Fox et al. ................... 361/699 |
| 5,314,010 A | 5/1994 | Sakaya et al. |
| 5,316,077 A * | 5/1994 | Reichard ............... 462/104.28 |
| 5,336,128 A | 8/1994 | Birdsong |
| 5,342,189 A | 8/1994 | Inamura et al. ............. 425/461 |
| 5,353,639 A | 10/1994 | Brookins et al. ............. 72/363 |
| 5,355,942 A * | 10/1994 | Conte .................... 165/104.33 |
| 5,388,635 A | 2/1995 | Gruber et al. ............. 165/80.4 |
| 5,409,055 A | 4/1995 | Tanaka et al. ......... 165/104.33 |
| 5,465,782 A | 11/1995 | Sun et al. |
| 5,535,816 A | 7/1996 | Ishida |
| 5,544,698 A * | 8/1996 | Paulman .................... 165/133 |
| 5,555,622 A | 9/1996 | Yamamoto et al. .... 29/890.053 |
| 5,567,493 A | 10/1996 | Imai et al. ................. 428/36.9 |
| 5,598,632 A * | 2/1997 | Camarda et al. ....... 29/890.032 |
| 5,615,086 A | 3/1997 | Collins et al. .............. 361/704 |
| 5,636,684 A | 6/1997 | Teytu et al. |
| 5,642,775 A | 7/1997 | Akachi |
| 5,651,414 A | 7/1997 | Suzuki et al. |
| 5,653,111 A | 8/1997 | Attey et al. |
| 5,660,229 A | 8/1997 | Lee et al. |
| 5,675,473 A | 10/1997 | McDunn et al. |
| 5,682,748 A | 11/1997 | DeVilbiss et al. |
| 5,689,957 A | 11/1997 | DeVilbiss et al. |
| 5,690,849 A | 11/1997 | DeVilbiss et al. |
| 5,692,558 A | 12/1997 | Hamilton et al. |
| 5,697,428 A * | 12/1997 | Akachi .................. 165/104.21 |
| 5,711,155 A | 1/1998 | DeVilbiss et al. |
| 5,727,619 A | 3/1998 | Yao et al. |
| 5,731,954 A * | 3/1998 | Cheon ........................ 361/699 |
| 5,737,186 A | 4/1998 | Fuesser et al. |
| 5,890,371 A | 4/1999 | Rajasubramanian et al. |
| 5,901,037 A | 5/1999 | Hamilton et al. ........... 361/699 |
| 5,901,040 A | 5/1999 | Cromwell et al. |
| 5,960,866 A | 10/1999 | Kimura et al. ......... 165/104.33 |
| 5,989,285 A | 11/1999 | DeVilbiss et al. |
| 6,032,726 A * | 3/2000 | Wright et al. ............ 165/109.1 |
| 6,041,850 A | 3/2000 | Esser et al. |
| 6,058,712 A | 5/2000 | Rajasubramanian et al. |
| 6,072,697 A | 6/2000 | Garcia-Ortiz |
| 6,101,715 A | 8/2000 | Fuesser et al. |
| 6,148,906 A * | 11/2000 | Li et al. ................. 165/104.33 |
| 6,293,333 B1 | 9/2001 | Ponnappan et al. |
| 6,302,192 B1 | 10/2001 | Dussinger et al. |
| 6,394,175 B1 | 5/2002 | Chen et al. |
| 6,397,935 B1 | 6/2002 | Yamamoto et al. |
| 6,457,515 B1 * | 10/2002 | Vafai et al. ................ 165/80.4 |
| 6,462,949 B1 | 10/2002 | Parish, IV et al. |
| 6,523,259 B1 | 2/2003 | Pinneo |
| 6,647,625 B2 * | 11/2003 | Wang et al. ........... 29/890.032 |
| 6,679,316 B1 | 1/2004 | Lin et al. |
| 6,698,502 B1 | 3/2004 | Lee |
| 6,745,825 B1 | 6/2004 | Nakamura et al. |
| 6,795,310 B2 | 9/2004 | Ghosh |
| 6,810,946 B2 | 11/2004 | Hoang |
| 6,820,684 B1 | 11/2004 | Chu et al. |
| 6,828,675 B2 | 12/2004 | Memory et al. |
| 6,834,712 B2 | 12/2004 | Parish et al. |
| 6,935,409 B1 | 8/2005 | Parish IV et al. |
| 2002/0189793 A1 | 12/2002 | Noda et al. |
| 2003/0089487 A1 | 5/2003 | Parish IV et al. |
| 2003/0127215 A1 | 7/2003 | Parish IV et al. |
| 2004/0099407 A1 | 5/2004 | Parish IV et al. |
| 2004/0112572 A1 | 6/2004 | Moon et al. |
| 2004/0177947 A1 | 9/2004 | Krassowski et al. |
| 2005/0006061 A1 | 1/2005 | Quisenberry et al. |
| 2005/0039887 A1 | 2/2005 | Parish IV et al. |
| 2005/0056403 A1 | 3/2005 | Norlin et al. |

FOREIGN PATENT DOCUMENTS

| | | |
|---|---|---|
| DE | 3117758 | 1/1982 |
| DE | 8512617 | 9/1985 |
| DE | 19849919 | 5/1999 |
| GB | 334209 | 8/1930 |
| GB | 1402509 | 8/1978 |
| GB | 2128319 A | 4/1984 |
| GB | 2128320 A | 4/1984 |
| JP | 53136749 | 11/1978 |
| JP | 63115251 | 5/1988 |
| JP | 06291481 | 10/1994 |
| SU | 1476297 | 4/1989 |
| SU | 589531 | 10/1994 |
| WO | WO-91/06958 | 5/1991 |
| WO | WO-95/26125 | 9/1995 |
| WO | WO-98/02060 | 1/1998 |
| WO | WO99/42781 | 8/1999 |
| WO | WO 00/70288 | 11/2000 |
| WO | WO 01/03484 A1 | 1/2001 |

OTHER PUBLICATIONS

"Furukawa Electric Heat Planar", undated material from Aug. 1999 trade show marketed by Furu Kawa Electric North America, Inc.

Andre Ali et al.; "Advanced Heat Pipe Thermal Solutions for Higher Power Notebook Computers"; Intel Corporation, Santa Clara, CA 1999; Thermacore, Inc. Lancaster, PA 1999; 6 pages.

"Gore's Polarchip Thermal Interface Materials . . . Bridge the Gap Between Hot PCBs and Cool Sinks."; W.L. Gore and Associates, Inc. 2000; 1 page.

"Thermal Management Components to Fill Virtually any Gap Configuration"; Stockwell Rubber Company; Nov. 2001.

U.S. Appl. No. 10/998,198, filed Nov. 26, 2004, Quisenberry et al.

U.S. Appl. No. 10/998,199, filed Nov. 26, 2004, Parish IV et al.

\* cited by examiner

COOLING APPARATUS HAVING LOW PROFILE EXTRUSION

This application is a divisional of Application Ser. No. 09/328,183, filed Jun. 8, 1999. which claims the benefit of Provisional Application Ser. No. 60/088,428. filed Jun. 8, 1998.

BACKGROUND

The present invention generally pertains to cooling apparatus, and more particularly, but not by way of limitation, to cooling apparatus using "low profile extrusions". As is explained in greater detail hereinbelow, such apparatus are extremely useful in printed circuit board (PCB) level cooling of electronic components, and for use as heat exchangers in applications where space is limited and/or low weight is critical. The present invention also pertains to an improved, high volume apparatus and method for manufacturing extruded hollow tubes for heat exchangers and heat pipes, including "low profile extrusions".

As used in this document, the term "low profile extrusion" refers to a heat exchange apparatus comprising an integral piece of metal having a series of micro extruded hollow tubes formed therein for containing a fluid. The low profile extrusions preferably have multi-void micro extruded tubes designed to operate under the pressures and temperatures required by modern environmentally safe refrigeration gases and to resist corrosion.

The micro extruded tubes are preferably interconnected at their ends so as to provide fluid communication between each tube. Such low profile extrusions are preferably formed from aluminum, although other conventional metals or metal alloys may also be used. The micro tubes can have a diameter from about 0.0625 inches to about 0.5 inches, but can also have significantly smaller diameters.

Such low profile extrusions can currently be manufactured with a profile, or height, as low as about 0.05 inches and with tubes of varying inner diameters. Of course, future advances may allow such low profile extrusions to be manufactured with an even smaller profile. Such low profile extrusions have been conventionally used in heat exchanger applications in the automotive industry, and are commercially available in strip form (having a generally rectangular geometry) or coil form (a continuous strip coiled for efficient transport). Preferred low profile extrusions are sold by Thermalex, Inc. of Montgomery, Ala. A brochure entitled "Thermalex, Inc.—Setting A Higher Standard in Aluminum Extrusions" (hereinafter the "Thermalex Brochure") provides additional detail regarding the Thermalex low profile extrusions and is incorporated herein by reference. U.S. Pat. No. 5,342,189, which is incorporated herein by reference, provides additional detail regarding an extrusion die for making such low profile extrusions. U.S. Pat. No. 5,353,639, which is incorporated herein by reference, provides additional detail regarding a method and apparatus for sizing a plurality of micro extruded tubes used in such low profile extrusions.

SUMMARY

In one embodiment, the present invention generally comprises a low profile extrusion, an inlet end cap, an inlet tube, an outlet end cap, an outlet tube, a heat transfer fluid, a means for circulating the heat transfer fluid, end means for removing heat from the heat transfer fluid. The low profile extrusion has a plurality of micro tubes with micro tube inlets and micro tube outlets, and an extrusion surface adapted for receiving heat from at least one heat generating component. The inlet end cap interconnects the micro tube inlets in fluid communication and connects the micro tube inlets in fluid communication with the inlet tube. The outlet end cap interconnects the micro tube outlets in fluid communication and connects the micro tube outlets in fluid communication with the outlet tube. The means for circulating the heat transfer fluid circulates the fluid through the inlet tube, inlet end cap, the plurality of micro tubes in the low profile extrusion, the outlet end cap, and the outlet tube.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION

The preferred embodiments of the present invention and their advantages are best understood by referring to FIGS. 1–8 of the drawings, like numerals being used for like and corresponding parts of the various drawings. The present invention is illustrated herein by example, and various modifications may be made by a person of ordinary skill in the art.

Figure 1:
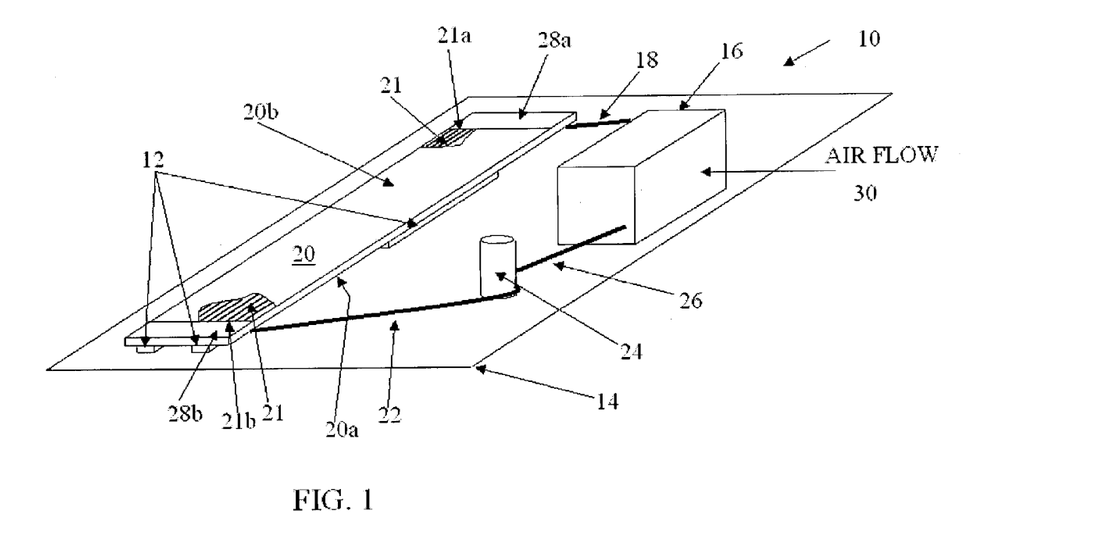
FIG. 1 is a schematic illustration of the present invention, shown as a circulation cooling apparatus for removal of heat from certain heat generating components.

FIG. 1 is a schematic illustration of a first preferred embodiment of the present invention showing a cooling apparatus used for removing heat from certain heat generating components 12 mounted on a printed circuit board 14. The printed circuit board 14 may be housed in a host electronic device (not shown) such as computer, a laptop or notebook computer, or other electronic equipment. Due to the ongoing miniaturization of such host electronic devices, the heat generating components 12 are often located in an area of the printed circuit board 14 and of the host electronic device where space is extremely limited, especially in the "z", or height dimension.

The cooling apparatus 10 generally includes a conventional liquid-to-air heat exchanger 16, an inlet tube 18, a low profile extrusion 20, an outlet tube 22, a conventional pump 24, and tubing 26. The low profile extrusion 20 has a plurality of micro tubes 21, each micro tube 21 having a micro tube inlet 21a and a micro tube outlet 21b. The extrusion 20 is preferably formed with a flat surface on its bottom side 20a for contacting heat generating components 12, and may be formed with external fins on its top side 20b to maximize heat transfer, if space allows. Extrusion 20 is also preferably formed with at least one solid channel (not shown) for mounting to printed circuit board 14. Conventional thermal interface material (not shown) is preferably provided between low profile extrusion 20 and heat generating components 12.

The micro tube inlets 21a of the micro tubes 21 in the extrusion 20 are interconnected in fluid communication, and to the inlet tube 18, by an inlet end cap 28a. Similarly, the micro tube outlets 21b of the micro tubes 21 in the extrusion 20 are interconnected in fluid communication, and to the outlet tube 22, by an outlet end cap 28b. The heat exchanger 16 may contain a fluid reservoir (not shown) therein for housing a fluid such as water, glycol, alcohol, or other conventional refrigerants. In this case, fluid from the heat exchanger 16 is circulated through the inlet tube 18, the low profile extrusion 20, the outlet tube 22, and the tubing 26 via the pump 24. Alternatively, the entire cooling apparatus 10 may be evacuated and charged with fluid which is then circulated via the pump 24.

During operation of the host electronic device, heat generated by heat generating components 12 is transferred from heat generating components 12 to low profile extrusion 20, to the fluid circulating within low profile extrusion 20, and then to heat exchanger 16. Heat exchanger 16 removes the heat from the fluid in a conventional manner. Preferably, an airflow 30 is passed over heat exchanger 16 to aid in such heat removal. Cooling apparatus 10 thus efficiently removes heat from a limited space, low profile area within the host electronic device (the location of low profile extrusion 20) to an area where it can be removed at a more convenient location and envelope (the location of heat exchanger 16).

Figure 2:
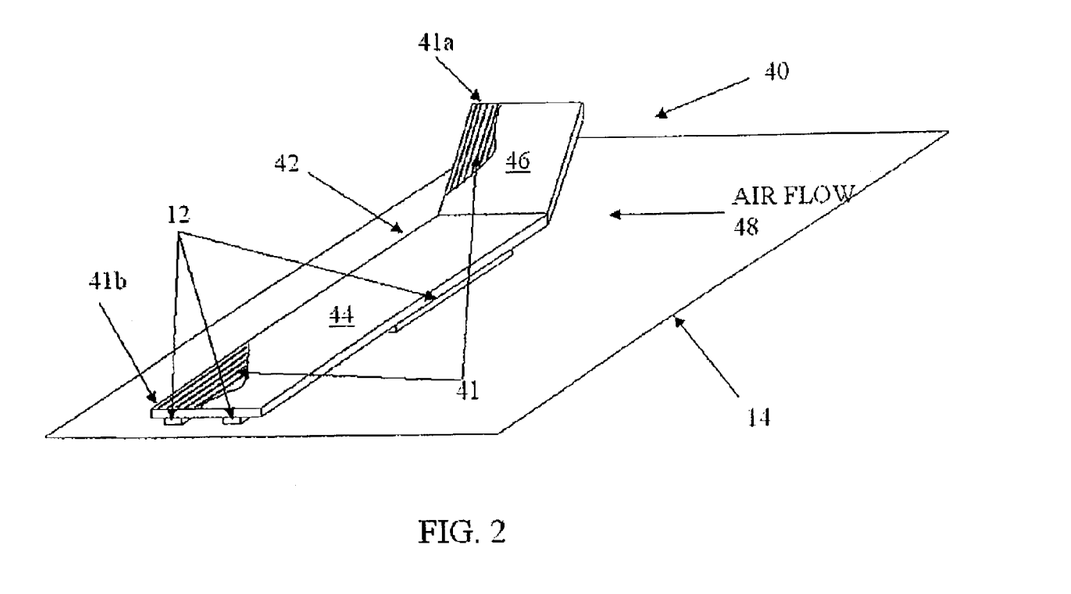
FIGS. 2 and 3 are schematic illustrations of another embodiment of the present invention, shown as the heat pipe type cooling apparatus for removal of heat from certain heat generating components.
Figure 3:
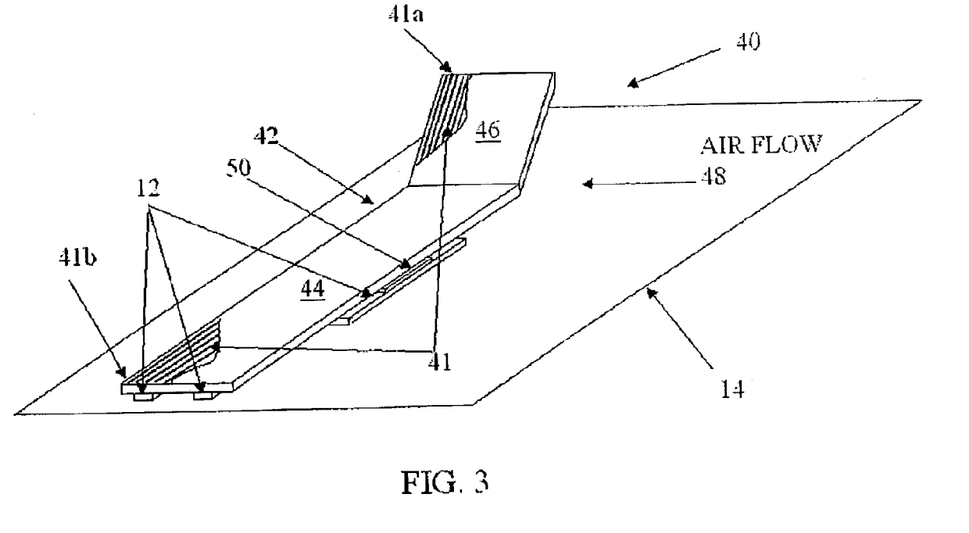

FIGS. 2 and 3 are schematic illustrations of a second preferred embodiment of the present invention showing a cooling apparatus 40 used for removing heat from heat generating components 12 on printed circuit board 14. Referring first to FIG. 2, cooling apparatus 40 generally comprises a low profile extrusion 42 manufactured as a heat pipe capable of phase change heat transfer. A preferred method of making a low profile extrusion 42 is described in greater detail hereinbelow. The low profile heat pipe extrusion 42 is preferably formed with micro tubes 41, each micro tube 41 having a conventional wick structure such as internal fins, grooved inner sidewalls, or metal screens, so as to maximize their heat transfer capability via capillary action.

To form a heat pipe, the micro tubes 41 of the low profile heat pipe extrusion 42 are evacuated and then charged with a fluid such as water, glycol, alcohol, or other conventional refrigerants before sealing the ends 41a and 41b of the micro tubes 41. As is known in the art, a heat pipe generally has an effective thermal conductivity of several multiples higher than that of a solid rod. This increase in efficiency is due to the fact that the phase change heat transfer coefficients are high compared to the thermal conductivity of conventional materials.

The low profile heat pipe extrusion 42 is preferably formed into a first portion 44 for contacting heat generating components 12 and a raised second portion 46. First portion 44 and second portion 46 are preferably substantially similar in construction to low profile extrusion 20 of FIG. 1, except end caps 28 are not required. First portion 44 acts as the evaporator section of the heat pipe, and second portion 46 acts as the condenser section of the heat pipe.

During operation of the host electronic device, heat generated by heat generating components 12 is transferred from heat generating components 12 to first portion 44. This heat causes the liquid within the micro tubes 41 in first portion 44 to change to vapor, consuming some of the generated heat. Because the vapor is less dense than the surrounding liquid, the vapor and associated heat rise into the micro tubes 41 in second portion 46. Of course, heated liquid may also be transferred from first portion 44 to second portion 46 via the capillary action of the wick structures of the micro extruded tubes therein. In second portion 46, the vapor condenses into liquid onto the inner side walls of the micro extruded tubes 41. The heat generated by the condensation reaction, as well as any heat transferred via capillary action of the wick structure, is then transferred to air flow 48. Cooling apparatus 40 thus efficiently removes heat from a limited space, low profile area within the host electronic device (the location of first portion 44) to an area where it can be removed at a more convenient location and envelope (the location of second portion 46). Of course, if low profile heat pipe extrusion 42 is formed with internal wick structures, it is not necessary that second portion 44 be raised from, or higher than, first portion 42.

Referring now to FIG. 3, low profile heat pipe extrusion 42 is shown in operation with a conventional thermoelectric cooler (TEC) 50 in contact with one of heat generating components 12. A preferred TEC is sold by Marlow Industries, Inc. of Dallas, Tex. TEC 50 facilitates the heat transfer between the heat generating component 12 and first portion 44 of low profile heat pipe extrusion 42, and thus is preferred for use with heat generating components 12 that have high power densities.

Figure 4:
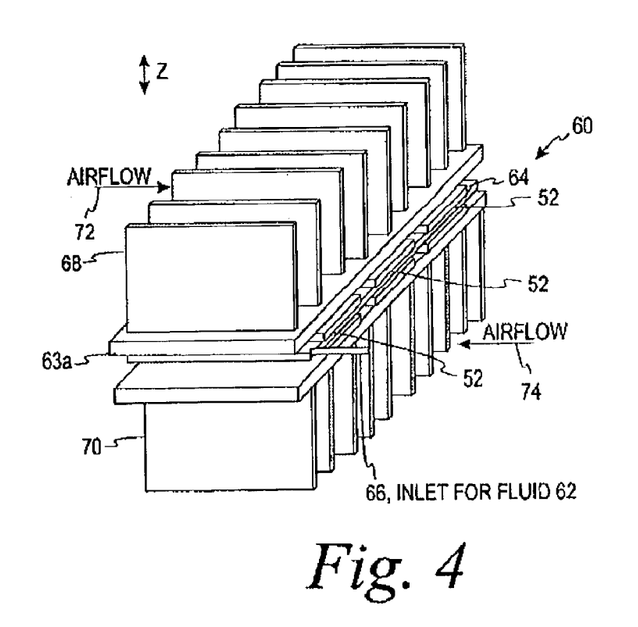
FIG. 4 is a schematic illustration of another embodiment of the present invention, shown as heat transfer component of a recirculatory system.

FIG. 4 is a schematic illustration of a third preferred embodiment of the present invention showing a cooling apparatus 60 used for removing heat from a fluid 62, such as water, glycol, alcohol, or other conventional refrigerants. Fluid 62 is then used to cool conventional heat generating components, such as heat generating components 12 of printed circuit board 14. By way of example, cooling apparatus 60 may be used in place of conventional heat exchanger 16 in FIG. 1.

Cooling apparatus 60 generally comprises a low profile extrusion 64, an inlet end cap 63a, an inlet tube 66, an outlet end cap (not shown), an outlet tube (not shown), thermoelectric coolers 52, and conventional bonded fin heat sinks 68 and 70. The low profile extrusion 64 is preferably substantially similar in construction to low profile extrusion 20 of FIG. 1, with a plurality of micro tubes (not shown) having a micro tube inlet and a micro tube outlet (not shown). The micro tube inlets of the micro tubes in the extrusion 64 are interconnected in fluid communication, and to the inlet tube 66, by the inlet end cap 63a. Similarly, the micro tube outlets of the micro tubes in the extrusion 64 are interconnected in fluid communication, and to the outlet tube, by an outlet end cap.

The low profile extrusion 64 preferably has generally flat bottom and top surfaces for contact with thermoelectric coolers (TEC) 52. The conventional bonded fin heat sink 68 is coupled to TECs 52 on the top surface of low profile extrusion 64, and the conventional bonded fin heat sink 70 is coupled to TECs 52 on the bottom surface of low profile extrusion 64.

In operation, the low profile extrusion 64 serves as a manifold, and the TECs 52 remove heat from fluid 62 flowing through the micro tubes of the low profile extrusion 64. This removed heat is transferred from TECs 52 to bonded fin heat sinks 68 and 70, which dissipate the heat to atmosphere in a conventional manner. Preferably, airflows 72 and 74 pass over and through heat sinks 68 and 70 to facilitate such heat dissipation.

Low profile extrusion 64 has a smaller size and mass than conventional heat exchanger manifolds. For example, a conventional manifold has a minimum profile, or height, in the "z" direction of about 0.75 inches, and low profile extrusion 64 may have a profile as low as about 0.1 inches. The reduced mass of low profile extrusion 64 is believed to produce a cooling apparatus 60 with a near zero time constant, increasing startup performance and temperature control. Therefore, cooling apparatus 60 is especially advantageous in applications involving lasers. The wavelength of a laser beam, and thus beam properties, is strongly influenced by temperature, and the tighter temperature control believed to be provided by cooling apparatus 60 is extremely beneficial.

Figure 5A:
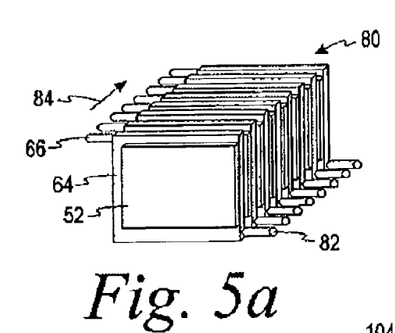
FIG. 5A is a schematic illustration of another embodiment of the present invention, shown as a liquid to liquid manifold cooling apparatus.
Figure 5B:
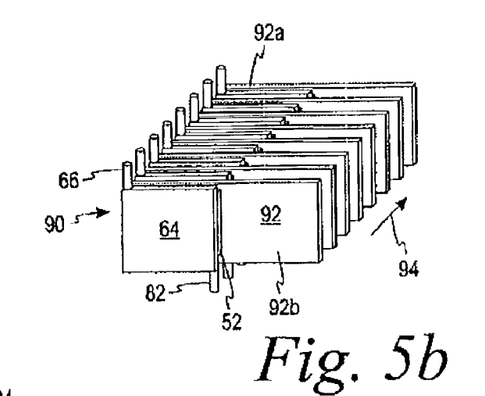
FIG. 5B is a schematic illustration of another embodiment of the present invention, shown as a liquid to air manifold cooling apparatus.
Figure 5C:
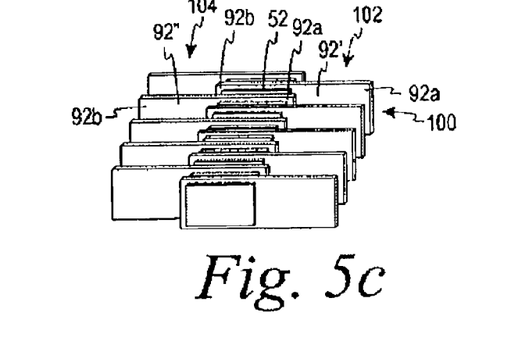
FIG. 5C is a schematic illustration of another embodiment of the present invention, shown as an air to air manifold cooling apparatus.

FIGS. 5A, 5B, and 5C are schematic illustrations of fourth, fifth, and sixth preferred embodiments of present invention. FIG. 5A shows a cooling apparatus 80 having a plurality of low profile extrusions 64 and TECs 52 arranged in a serial fashion. A TEC 52 is disposed between, and is in contact with, each of the extrusions 64. Only one low profile extrusion 64 and one TEC 52 is numbered in FIG. 5A for clarity of illustration. Fluid 62 enters each extrusion 64 via inlet 66 and exits each extrusion 64 via an outlet 82. In operation, TECs 52 remove heat from fluid 62 flowing through low profile extrusions 64. This removed heat is transferred to airflow 84 passing over cooling apparatus 80.

FIG. 5B shows a cooling apparatus 90 having a plurality of low profile extrusions 64, TECs 52, and low profile heat pipe extrusions 92 arranged in a serial fashion. More specifically, a TEC 52 is disposed between, and is in contact with, each low profile extrusion 64 and low profile heat pipe extrusion 92. Only one low profile extrusion 64, one TEC 52, and one low profile heat pipe extrusion 92 are numbered in FIG. 5B for clarity of illustration. Each low profile heat pipe extrusion 92 is preferably substantially similar in construction to low profile heat pipe extrusion 42 of FIG. 2, excluding raised portion 46. Fluid 62 enters each extrusion 64 via inlet 66 and exits each extrusion 64 via outlet 82. In operation, each TEC 52 removes heat from fluid 62 flowing through an adjacent low profile extrusion 64. This removed heat is transferred to the evaporator portion 92a of the adjacent low profile heat pipe extrusion 92. The heat is then transferred to the condenser portion 92b of the low profile heat pipe extrusion 92, as is explained hereinabove in connection with low profile heat pipe extrusion 42 of FIGS. 2 and 3. An airflow 84 passing over cooling apparatus 90 dissipates heat from each condenser portion 92b of each low profile heat pipe extrusion 92.

FIG. 5C shows a cooling apparatus 100 having a plurality of TECs 52 and low profile heat pipe extrusions 92 arranged in a serial fashion. More specifically, a TEC 52 is disposed between, and is in contact with, each low profile heat pipe extrusion 92, and the "free end" of adjacent low profile heat pipe extrusions 92 extend in opposite directions. Only one TEC 52 and two low profile heat pipe extrusions, 92' and 92", are numbered in FIG. 5C for clarity of illustration. In operation, a hot airflow 102 flows over each evaporator portion 92a of low profile heat pipe extrusions 92'. This heat is transferred from evaporator portion 92a to condenser portion 92b of extrusion 92', as is explained hereinabove in connection with low profile heat pipe extrusion 42 of FIGS. 2 and 3. Condenser portion 92b of extrusion 92' is in contact with TEC 52. The TEC 52 removes heat from condenser portion 92b of extrusion 92' and transfers it to evaporator portion 92a of low profile heat pipe extrusion 92". This heat is then transferred from evaporator portion 92a to condenser portion 92b of extrusion 92". Cold airflow 104 passing over condenser portions 92b of each extrusion 92" dissipates heat from cooling apparatus 100.

Cooling apparatus 80, 90, and 100 have the same applications and advantages of cooling apparatus 60 described hereinabove. As will be appreciated by one skilled in the art, cooling apparatus 60, 80, and 90 may also be operated as heating apparatus by using thermoelectric coolers (TECs) 52 to heat, rather than to cool, a fluid.

Figure 6:
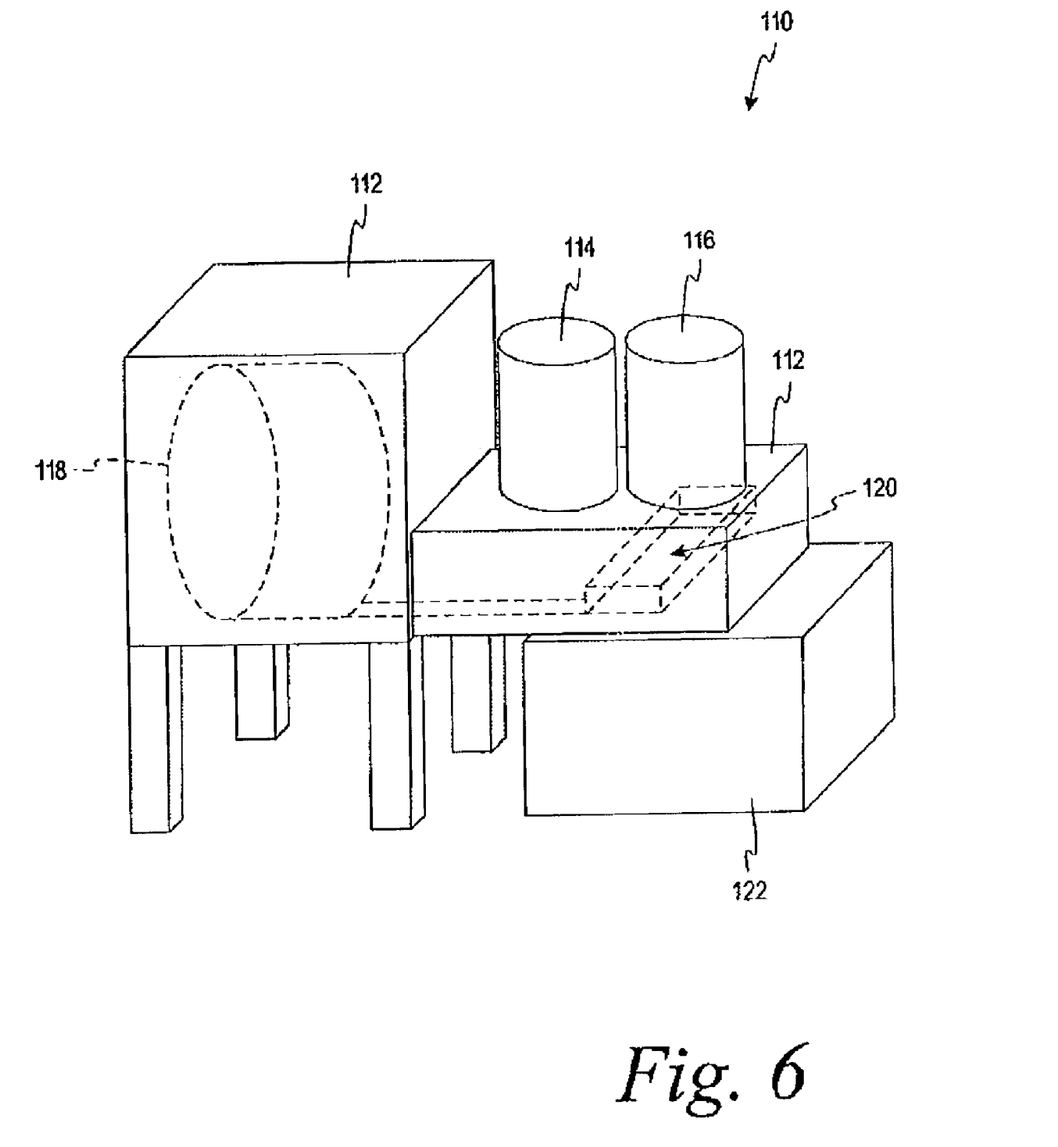
FIG. 6 is a is a schematic illustration of a method and apparatus for manufacturing heat pipes according to an embodiment of the present invention.

FIG. 6 is a schematic illustration of a method and apparatus for manufacturing heat pipes according to a seventh preferred embodiment of the present invention. As noted hereinabove, the preferred apparatus and method may be utilized to make low profile heat pipe extrusions 42 and 92 of FIGS. 2, 3, 5B, and 5C. However, the preferred apparatus and method may also be utilized to make extruded hollow tubes for other heat exchangers and heat pipes.

Apparatus 110 generally includes an oven 112 having a sealable housing. A vacuum station 114 and a fluid charging station 116 are in fluid communication with oven 112. A coil 118 is disposed within a portion of oven 112 on a conventional automatic feed system. Coil 118 may be a coil of hollow tubing, a coil of low profile extrusion, or a coil of other conventional extrusion having a series of extruded hollow tubes therein. An ultrasonic welder/sealer is also disposed in oven 112. A preferred ultrasonic welder/sealer is the Ultraseal® series sold by American Technology, Inc. of Shelton, Conn. A brochure entitled "Ultraseal®-20 20 kHz Portable Ultrasonic Metal Tube Sealer" (hereinafter the "Amtech Brochure") provides additional information regarding the Ultraseal® series of ultrasonic welder/sealers and is incorporated herein by reference.

In a conventional process, the first step is actually forming and cutting the heat exchanger, heat pipe, or extruded tubes into the desired configuration. Next, this preformed system is evacuated and charged with a fluid such as water, glycol, alcohol, or other conventional refrigerants. The system is then sealed, completing the process. Conventional processes are expensive because they are labor intensive and require long setup times for different configurations of heat exchangers, heat pipes, or extruded tubes.

However, apparatus 110 may be used to efficiently and economically produce heat exchangers, heat pipes, and extruded tubes, including low profile extrusions, according to the following preferred process. First, coil 118 is placed within oven 112 on the automatic feed system. Second, coil 118 is evacuated using vacuum station 114. Preferably, coil 118 is pulled down to a vacuum of about $10^{-7}$ torr for a period of approximately twenty four hours. Third, coil 118 is charged with a known amount of fluid, such as water, glycol, alcohol, or other conventional refrigerants, using charging station 116. Fourth, oven 112 heats coil 118 until all of the fluid is in the vapor phase, and the vapor fills the interior of coil 118 evenly. Fifth, using the automatic feed system, the heated and charged coil 118 is reeled out, and is crimped, sealed, and cut into desired lengths using ultrasonic welder/sealer 120. When forming tube heat pipes, ultrasonic welder/sealer 120 preferably canoe crimps the extrusions. Finished product is collected within container 122. In this manner, heat exchangers, heat pipes, and extruded tubes, including low profile extrusions, are formed while charged with fluid, significantly reducing the setup time and vacuum expense over conventional processes.

Figure 7:
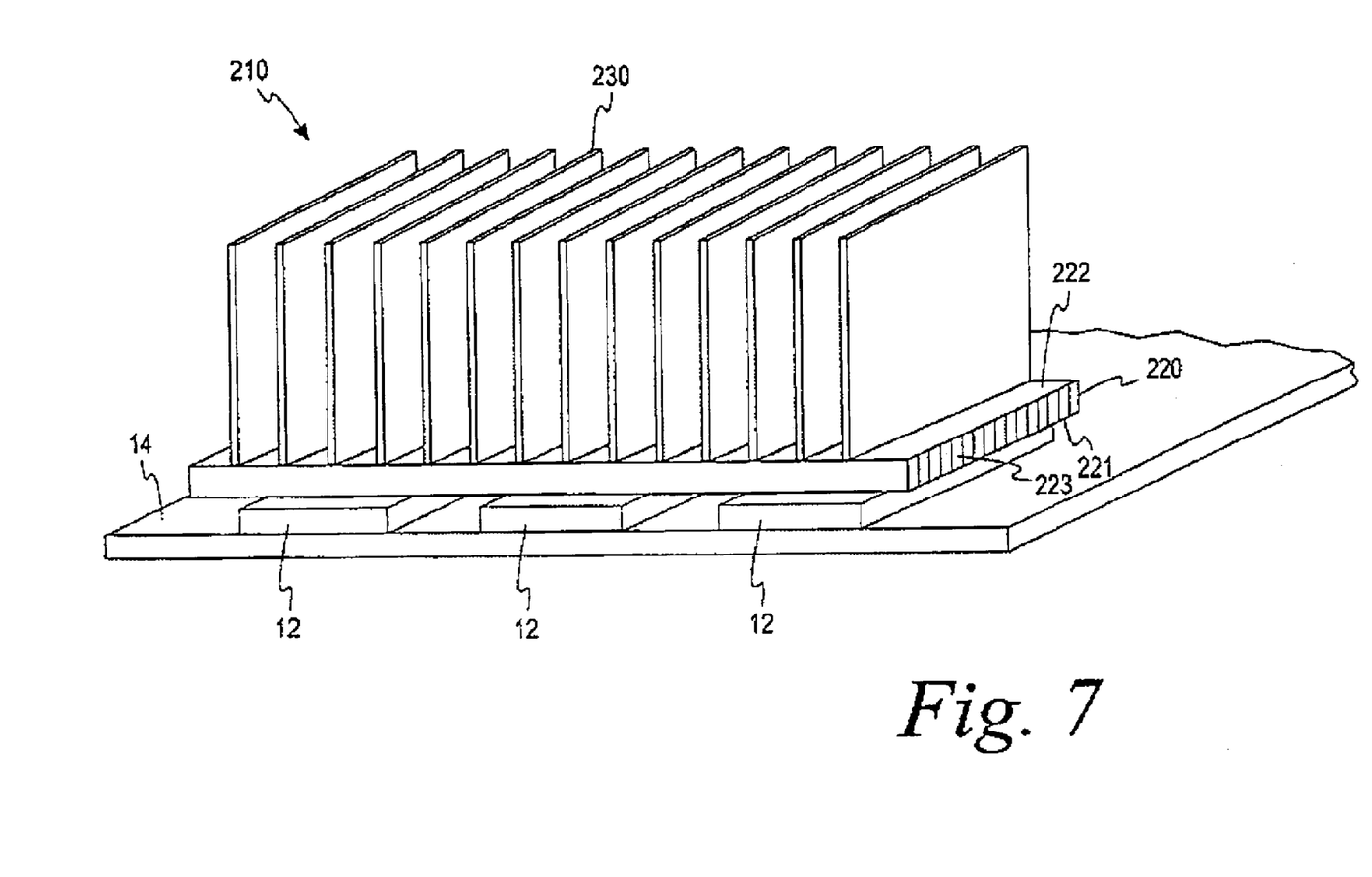
FIG. 7 is a schematic illustration of another embodiment of the present invention, shown as heat pipe base/fin cooling apparatus.

FIG. 7 illustrates another embodiment of the present invention, showing a cooling apparatus 210 used for removing heat from heat generating components 12 on printed circuit board 14. The cooling apparatus 210 comprises a low profile extrusion 220 manufactured as a heat pipe capable of phase change heat transfer. The low profile heat pipe extrusion 220 is formed having a plurality of micro tubes 230, preferably having therein conventional wick structure inside such as internal fins, grooved inner side walls, or metal screens, so as to maximize there heat transfer capability via capillary action. The micro tubes 223 of the low profile heat pipe extrusion 220 are evacuated and then charged with a fluid such as water, glycol, alcohol, or other conventional refrigerants, before the ends of the micro tubes are sealed.

The low profile heat pipe extrusion 220 has a first surface 221 for engaging the heat generating components 12 and receiving heat transfer therefrom. On a second surface 222 of the low profile extrusion 220, a conventional bonded fin heat sink 230 or plurality of cooling fins are mounted to the low profile extrusion 220. Preferably, the micro tubes 223 are disposed in a direction perpendicular to the fins 230 for transfer of heat between each of the individual fins 230. The heat transfer between the individual fins 230 promotes the even distribution of heat across each of the individual fins 230. However, the micro tubes 223 can be oriented for the transfer of heat along the length of the fins 230. Additionally, in one preferred embodiment, the micro extruded hollow tubes 223 in the low profile extrusion 220 are oriented for disbursing heat from the heat generating components 12 to areas of the low profile extrusion 220 which are not in contact with a heat generating components 12.

The use of the low profile extrusion 220 for transferring heat in the cooling apparatus 200 increases the effective surface area that heat is transferred from the heat generating components to the cooling fins 230. The resulting cooling apparatus is therefore smaller in size and lighter in weight for the same effective cooling attributes. In some embodiments, the present invention can decrease the weight of an apparatus for cooling a heat generating component by as much as 50% over traditional fins mounted via a metal plate.

Figure 8:
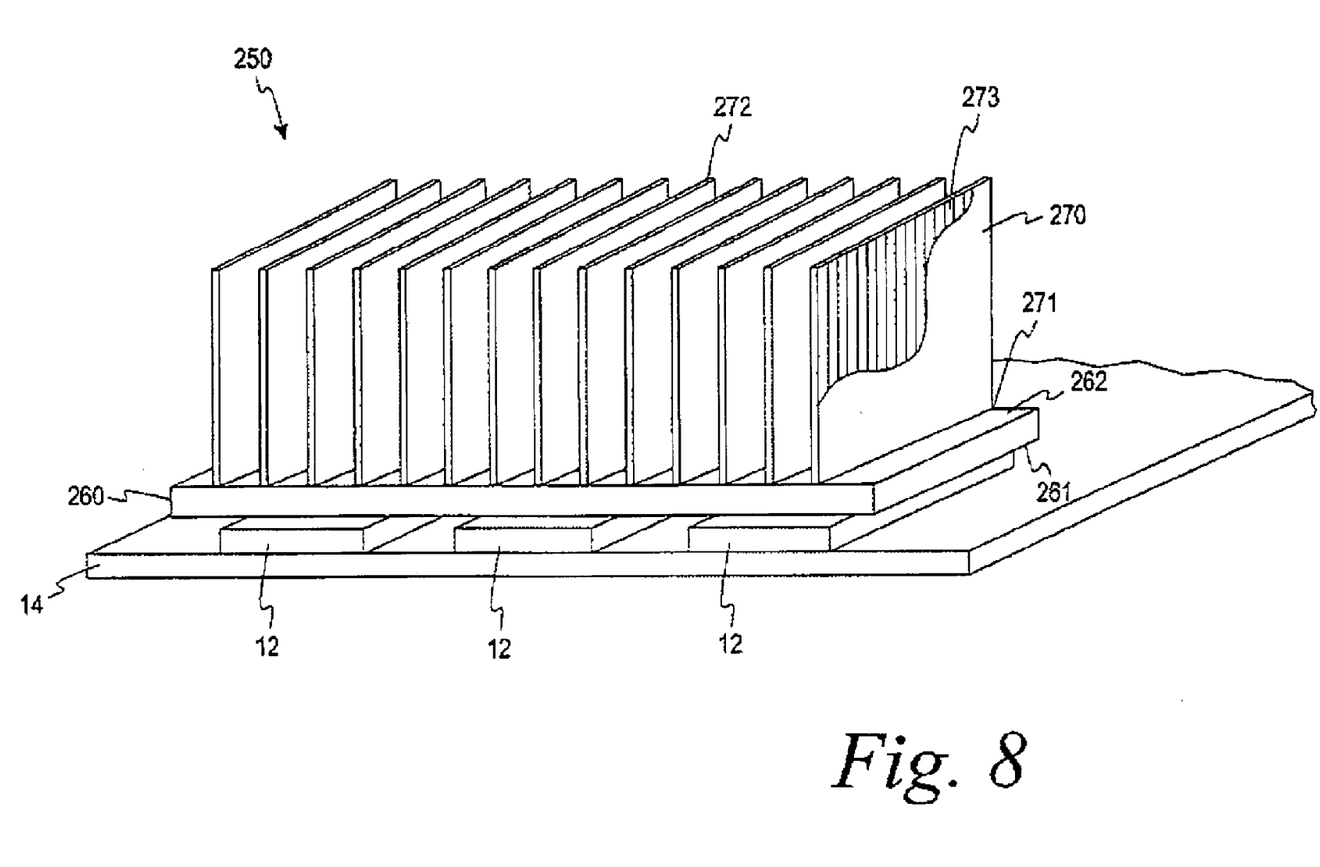
FIG. 8 is a schematic illustration of another embodiment of the present invention, shown as a base/heat pipe fin cooling apparatus.

FIG. 8 illustrates another embodiment of the present invention, showing a cooling apparatus 250 used for removing heat from heat generating components 12 on printed circuit board 14. The cooling apparatus generally comprises a base 260 and a plurality of low profile extrusion fins 270. The base 260 has a first side 261 for heat transfer between the cooling apparatus 250 and heat generating components 12. The base 260 also has a second surface 262 for mounting the low profile extrusion fins 270.

The low profile extrusion fins 270 are low profile extrusions manufactured as a heat pipe capable of phase change heat transfer. The low profile extrusion heat piping 270 are preferably formed with a plurality of micro tubes 273 each preferably having a conventional wick structure such as internal fins, grooved inner side walls, or metal screens, so as to maximize the heat transfer capability via capillary action. The micro tubes 273 of the low profile extrusion heat piping 270 are evacuated and then charged with a fluid such as water, glycol, alcohol, or other conventional refrigerants, before the micro tubes 273 are sealed.

A first end 271 of the low profile extrusion fins 270 is mounted to the second surface 262 of the base 260 with a second end 272 extending outwardly therefrom. The plurality of low profile extrusion fins 270 are preferably mounted in rows for convection heat transfer to the surrounding environment. In one embodiment, the base 260 can also be formed from a low profile extrusion similar to the low profile extrusion 220 in FIG. 7.

The use of the heat pipe type low profile extrusion fins 270 in the cooling apparatus 250 increases the effective surface area in which heat is transferred from the heat generating components to the surrounding environment via the base 260. The resulting cooling apparatus is therefore smaller in size and lighter in weight for the same effective cooling attributes.

It is believed that the operation and construction of the present invention will be apparent from the foregoing description of a preferred embodiment. While the device shown is described as being preferred, it will be obvious to a person of ordinary skill in the art that various changes and modifications may be made therein without departing from the spirit and scope of the invention as defined in the following claims. Therefore, the spirit and the scope of the appended claims should not be limited to the description of the preferred embodiments contained herein.

What is claimed is:

1. A pumped cooling system for removing heat from at least one heat generating component, said cooling apparatus comprising:

a pumped adapted for pumping a heat transfer fluid;

a heat exchanger;

a low profile extrusion having a profile not greater than about 0.1 inch and defining an interior space, said low profile extrusion having a first exterior surface adapted for receiving heat from the at least one heat generating component, said low profile extrusion connected in fluid communication with the pump and the heat exchanger;

said interior space comprising a plurality of microtubes adapted for receiving the heat transfer fluid therein for flow therethrough for the transfer of heat received from the at least one heat generating component, wherein each microtube has an inlet and an outlet;

said heat exchanger adapted to receive the heat transfer liquid from the interior space and remove heat from the heat transfer fluid;

an inlet end cap in fluid communication with the plurality of microtubes and fluidly interconnecting the microtube inlets;

an outlet end cap in fluid communication with the plurality of microtubes and fluidly interconnecting the microtube outlets; and wherein at least one of the inlet end cap and the outlet end cap is in direct contact with the at least one heat generating component.

2. The pumped cooling system of claim 1, wherein said interior space is divided by at least one longitudinal member.

3. The pumped cooling system of claim 2, wherein said at least one longitudinal member is offset from vertical.

4. The pumped cooling system of claim 3, wherein said low profile member defines a first end and a second end, wherein said interior space of said low profile member is sealed at each of said first end and said second end.

5. The pumped cooling system of claim 4, wherein said condenser section is elevated with respect to said evaporator section.

6. The pumped cooling system according to claim 1 further comprising:
   at least one capillary groove on an interior surface of each of said plurality of micro tubes.

7. The pumped cooling system of claim 1, wherein each of said plurality of micro tubes are connected in fluid communication.

8. The pumped cooling system of claim 7, further comprising a wick within each of said micro tubes.

9. The pumped cooling system of claim 8, wherein said wick is a metal screen.

10. The pumped cooling system of claim 9, wherein a plurality of said low profile extrusions are mounted as fins on a heat sink.

11. The pumped cooling system of claim 10, further comprising: at least one fin on an interior surface of said interior space.

12. The pumped cooling system of claim 11, further comprising at least one wick within said interior space.

13. The pumped cooling system of claim 12, wherein said wick is a metal screen.

14. The pumped cooling system of claim 1, further comprising at least one thermoelectric cooling unit disposed between said at least one heat generating component and said first exterior extrusion surface.

15. A pumped cooling system and heat generating component combination comprising:
   a pump adapted for pumping a heat transfer fluid;
   a heat exchanger;
   at least one heat generating component;
   a low profile extrusion having a profile not greater than about 0.1 and defining an interior space, said low profile extrusion having a first exterior surface adapted for receiving heat from said at least one heat generating component, said low profile extrusion connected in fluid communication with the pump and the heat exchanger;
   the interior space comprising a plurality of microtubes adapted for receiving the heat transfer fluid therein for absorbing heat from said at least one heat generating component, said heat transfer fluid being circulated to the heat exchanger from the interior space, wherein the plurality of microtubes are interconnected at their ends so as to provide communication of the heat transfer fluid between each of the plurality of microtubes; and
   said heat exchanger adapted to remove heat from the heat transfer fluid,
   an inlet end cap in fluid communication with the plurality of microtubes and fluidly interconnecting the microtube inlets;
   an outlet end cap in fluid communication with the plurality of microtubes and fluidly interconnecting the microtube outlets; and
   wherein at least one of the inlet end cap and the outlet end cap is in direct contact with the at least one heat generating component.

16. The pumped cooling system of claim 15, wherein said interior space is divided by at least one longitudinal member.

17. The pumped cooling system of claim 16, wherein said at least one longitudinal member is offset from vertical.

18. The pumped cooling system of claim 17, wherein said low profile member defines a first end and a second end, wherein said interior space of said low profile member is sealed at each of said first end and said second end.

19. The pumped cooling system of claim 18, wherein the extrusion includes a condenser section which is elevated with respect to an evaporator section.

20. The pumped cooling system according to claim 15 further comprising:
   at least one fin on an interior surface of each of said plurality of micro tubes.

21. The pumped cooling system of claim 15, wherein each of said plurality of micro tubes are connected in fluid communication.

22. The pumped cooling system of claim 21, further comprising a wick within each of said micro tubes.

23. The pumped cooling system of claim 22, wherein said wick is a metal screen.

24. The pumped cooling system of claim 23, further comprising:
   at least one fin on an interior surface of said interior space.

25. The pumped cooling system of claim 24, wherein a plurality of said low profile extrusions are mounted as fins on a heat sink.

26. The pumped cooling system of claim 25, further comprising at least one wick within said interior space.

27. The pumped cooling system of claim 26, wherein said wick is a metal screen.

* * * * *

UNITED STATES PATENT AND TRADEMARK OFFICE
CERTIFICATE OF CORRECTION

| | |
|---|---|
| PATENT NO. | : 7,322,400 B2 |
| APPLICATION NO. | : 10/328438 |
| DATED | : January 29, 2008 |
| INVENTOR(S) | : Overton L. Parish, IV and Roger S. DeVilbiss |

It is certified that error appears in the above-identified patent and that said Letters Patent is hereby corrected as shown below:

On the title page item (56),
IN REFERENCES CITED, FOREIGN PATENT DOCUMENTS

Replace      "JP 63115251"
With         --JP 63115351--

COLUMN 2, LINE 61

Insert       the numeral --10-- after the word "apparatus"

Signed and Sealed this

Twenty-first Day of October, 2008

JON W. DUDAS
*Director of the United States Patent and Trademark Office*